United States Patent [19]
Kucharewski

[11] 4,069,431
[45] Jan. 17, 1978

[54] AMPLIFIER CIRCUIT

[75] Inventor: Nicholas Kucharewski, Lebanon, N.J.

[73] Assignee: RCA Corporation, New York, N.Y.

[21] Appl. No.: 753,500

[22] Filed: Dec. 22, 1976

[51] Int. Cl.² .................... H03K 5/20; H03F 3/185; H03F 3/45; H03G 3/30
[52] U.S. Cl. .................................. 307/355; 307/290; 307/359; 330/253; 330/254; 330/257; 330/277; 330/282; 330/288
[58] Field of Search ............................ 330/22, 29, 35; 307/290, 355, 356, 359, 304

[56] References Cited
U.S. PATENT DOCUMENTS

| 3,659,121 | 4/1972 | Frederiksen | 330/22 X |
| 3,832,645 | 8/1974 | Gruetman | 330/29 |
| 3,943,380 | 3/1976 | Morgan et al. | 330/35 X |

Primary Examiner—James B. Mullins
Attorney, Agent, or Firm—H. Christoffersen; Allen LeRoy Limberg; Lawrence P. Benjamin

[57] ABSTRACT

A current mirror amplifier (CMA) with controlled current gain, the current gain being changed, for example, responsive to the output condition of a comparator in which the CMA is used in a differential signal combining circuit. In such a comparator application the switched gain of the CMA imparts hysteresis to the comparator characteristics.

11 Claims, 3 Drawing Figures

AMPLIFIER CIRCUIT

This application relates to current mirror amplifiers (CMA's) with controlled, variable current gain which find use, for example, in comparator circuits exhibiting hysteresis.

Figure 1:
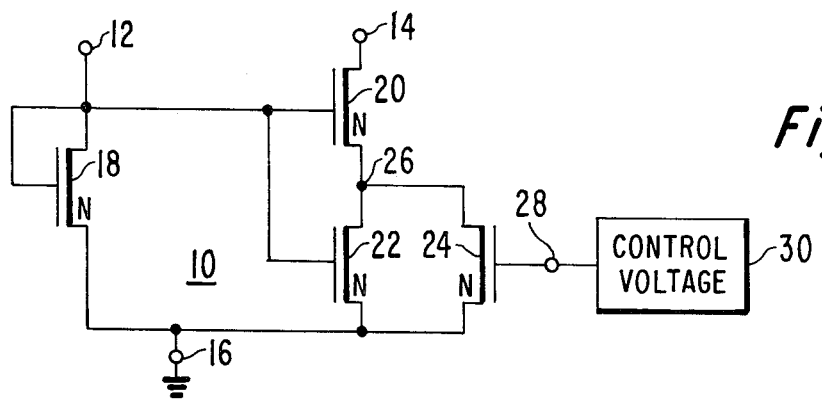
FIGS. 1 and 2 are each schematic diagrams of a controlled gain amplifier embodying the present invention.

Referring to FIG. 1, current mirror amplifier (CMA) 10 has an input terminal 12 for receiving a unidirectional input current, an ouput terminal 14 and a common terminal 16 for connection to a point of reference potential, herein ground. Transistors 18, 20, 22 and 24 are N-channel, enhancement-mode insulated-gate field-effect transistors of the conductor-insulator semiconductor type — e.g., the metal-oxide-semiconductor or MOS type.

Transistor 18 has a controlled conduction path between its drain electrode, connected to terminal 12, and its source electrode, connected to terminal 16. The conductivity of the conduction path is controlled by the potential applied between its source electrode and its gate or control electrode. Transistor 18 is provided with a direct-coupled drain-to-gate feedback connection, shown in FIG. 1 as consisting of a direct drain-to-gate connection. This feedback connection adjusts the gate potential of transistor 18 to condition the controlled conduction path of this transistor to conduct the current applied to input terminal 12, so that substantially all of this input current flows through the CMA input current path to common terminal 16.

The gate potential of transistor 18 depends, not only on the level of current through its conduction path but also on the dimensions of that channel. These dimensions determine, in part, the transconductance ($g_m$) of the device. For transistors having similar doping characteristics, their transconductances are proportional to their relative ratios of channel width (W) to channel length (L). For example, if the W/L ratio of two such transistors are equal, so are their transconductances.

If the gate-source voltage of transistor 18, which transistor may be considered a master transistor, is applied to a second transistor, which latter transistor may be considered a slave transistor, a current is established through the slave transistor. The resultant current through the slave transistor is substantially equal to the current through the master transistor multiplied by a factor -G, where G is a positive real quantity equal to the $g_m$ of the slave transistor divided by the $g_m$ of the master transistor. By way of example, if the $g_m$ of each device is equal, the output current magnitude substantially equals that of the input current.

Referring to FIG. 1, the gate electrodes of transistors 18, 20 and 22 are connected to the same node; so the gate potentials of transistors 18, 20 and 22 are alike. The controlled conduction paths of transistors 22 and 24 are each connected between terminal 16 and a node 26. Node 26 is the source electrode end of the controlled conduction path of transistor 20 opposite to the drain electrode and connected to output terminal 14. The gate or control electrode of transistor 24 is connected at terminal 28 to control voltage source 30.

Assume initially that transistor 24 is turned off by, for example, the application to its gate electrode of a voltage equal to the reference potential. Suppose that the channel widths of transistors 20 and 22 are each chosen to equal that of transistor 18, W, and the channel length of each of these devices is chosen to equal L/2 where L equals the channel length of transistor 18. With transistor 24 off, the behavior of transistors 20 and 22 between terminals 14 and 16 is, because of the series connection of their conduction paths, substantially equivalent to a single transistor of a channel width W and channel length L. The dimensions of the component transistors thus ensure that the input and output current path $g_m$'s are equal. Thus, with transistor 24 off, the gain G of CMA 10 is −1.

To vary the gain of CMA 10, transistor 24 is turned on by a signal from the control voltage sources 30. If the W/L ratio of transistor 24 is chosen to be large compared to that of transistor 22, for example, and the control voltage is large enough in amplitude to drive transistor 24 into full conduction, then transistor 24 may be considered a switch whose impedance when closed is very much less than the conduction path impedance of transistor 22. In this case, transistor 22 may be considered to be replaced by a short circuit when transistor 24 is on. Because the channel length of transistor 20 is one-half that of transistor 18, the effective $g_m$ of the CMA output current path is now twice that of the input path, causing gain of CMA 10 is equal minus two. In summary, with transistor 24 off, the CMA gain equals minus one and with this device on the CMA gain equals minus two. Because of the finite, non-zero path impedance of device 24, for the above stated relative dimensions, the CMA gain may not exactly equal minus two when transistor 24 is on. However, the dimensions of transistors 20, 22 and 24 may be so proportioned that one can obtain any desired ratio of current gains for the limit conditions where transistor 24 is on and where transistor 24 is off. (Current gains between these limit values can be obtained by baising the gate electrode of transistor 24 so the controlled conduction path of transistor 24 is partially conductive.)

It should be appreciated that the CMA gains disclosed herein are merely illustrative examples. The lower value of G for CMA 10 may be a number greater or less than unity and its upper value need not be twice the lower value. An analog voltage may be applied to the gate electrode of transistor 24. This would vary its conduction path impedance continuously, rather than in discrete steps, thereby providing a similar continuous variation of the CMA gain. Additionally, switching device 24 may be replaced by other devices having the desired switching characteristics. The effective conduction path dimension varied to vary $g_m$ may be length as disclosed above or, in accordance wih the teachings of the present application, width or a combination of width and length.

Where width is the parameter varied, a transistor may have its control electrode connected to the CMA input terminal and its conduction path serially connected with a switch. This series combination may be connected in parallel with the output current path of a CMA to impart a variable gain characteristic to the CMA. Finally, the circuit of FIG. 1 may be realized with devices of opposite conductivity to those shown upon suitable choice of operating potentials.

Figure 2:
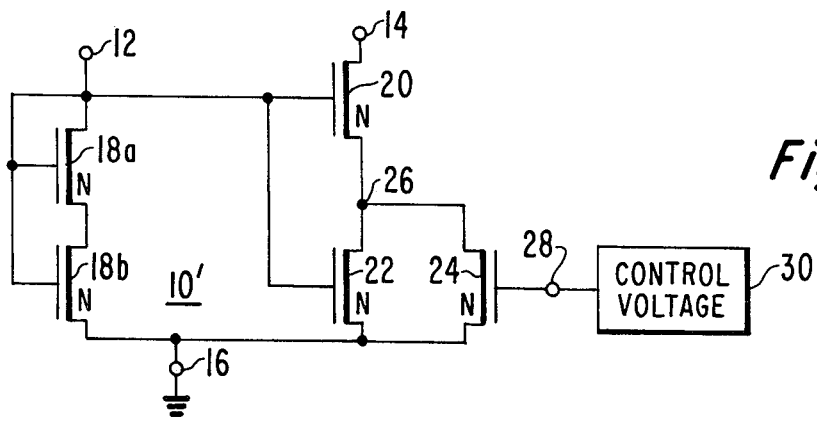

FIG. 2 shows a controlled-current-gain CMA 10' similar in all respects to that of FIG. 1, except that the self-biased input transistor 18 is replaced by transistors 18a and 18b. The conduction paths of transistors 18a and 18b are serially connected between terminals 12 and 16. The control electrodes of transistors 18a and 18b are interconnected at terminal 12.

The FIG. 2 CMA 10' configuration is advantageous where the controlled-current-gain amplifier is to be realized in integrated circuit form and certain gain ratios are desired. For example, if it is desired that the lower value of G is to equal unity (when transistor 24 is off) and transistors 20 and 22 each have channel lengths equal to L units, then for G to equal the desired value in the circuit of FIG. 1, the channel length of transistor 18 must equal 2L units. If the circuit of FIG. 2 is utilized, the channel length of each of transistors 18a and 18b may equal L units. This means that transistors 18a, 18b, 20 and 22 may be devices having equal dimensions, thereby simplifying the layout arrangement when CMA 10' is realized in integrated circuit form. The mode of operation of CMA 10' is realized in integrated circuit form. The mode of operation of CMA 10' wherein its input current path is via the channels or controlled conduction paths of transistors 18a and 18b is the same as that of CMA 10 wherein its input current path is via the channel or controlled conduction path of transistor 18.

The circuits of FIGS. 1 or 2 may be advantageously utilized to impart a hysteresis characteristic to a comparator circuit. A comparator is an amplifier circuit that produces output voltages having first and second levels depending on whether the amplitude of an input signal is greater or less than that of a reference signal. If hysteresis is introduced into the switching characteristics of a comparator, then the amplitude of the signal that causes the comparator to change state depends on whether the amplitude of this signal is increasing or decreasing with respect to the reference amplitude. Hysteresis reduces the likelihood of an undesired transition of the comparator state when relatively low level electrical noise is present in the waveform of the signal applied to the comparator.

Comparator circuits, utilizing operational amplifiers, that have hysteresis characteristics are known in the art. Such a circuit generally comprises an operational amplifier and a resistive voltage divider network. This divider is connected at its input and common terminals between the amplifier output terminal and a reference potential source respectively with the dividers output terminal being connected to one of the amplifier input terminals.

Such a circuit tends to have several shortcomings. For example, the impedance presented to the reference source is not the near infinite impedance of an ideal operational amplifier but is instead determined, in part, by the impedance of the elements comprising the resistive network. If such a comparator is realized in integrated circuit form, and if a very high load impedance is required by the reference source, then the resistors comprising the divider network may have values that are too large to be practically realized.

Additionally, it is often desired to impart hysteresis to a comparator only when the signal amplitude is changing a particular direction with respect to the reference input. For example, in a voltage comparator, hysteresis may be desired when the signal input voltage is increasing in amplitude with respect to the reference voltage but not when this signal voltage is decreasing. This means that the value of the signal amplitude that induces one of the transitions of the comparator is precisely known because its value is independent of the amount of hysteresis present. While it is known that the above described operational amplifier hysteresis comparator may be modified by the inclusion of additional circuit elements to thereby include this characteristic, such a modified circuit is rather complex.

Figure 3:
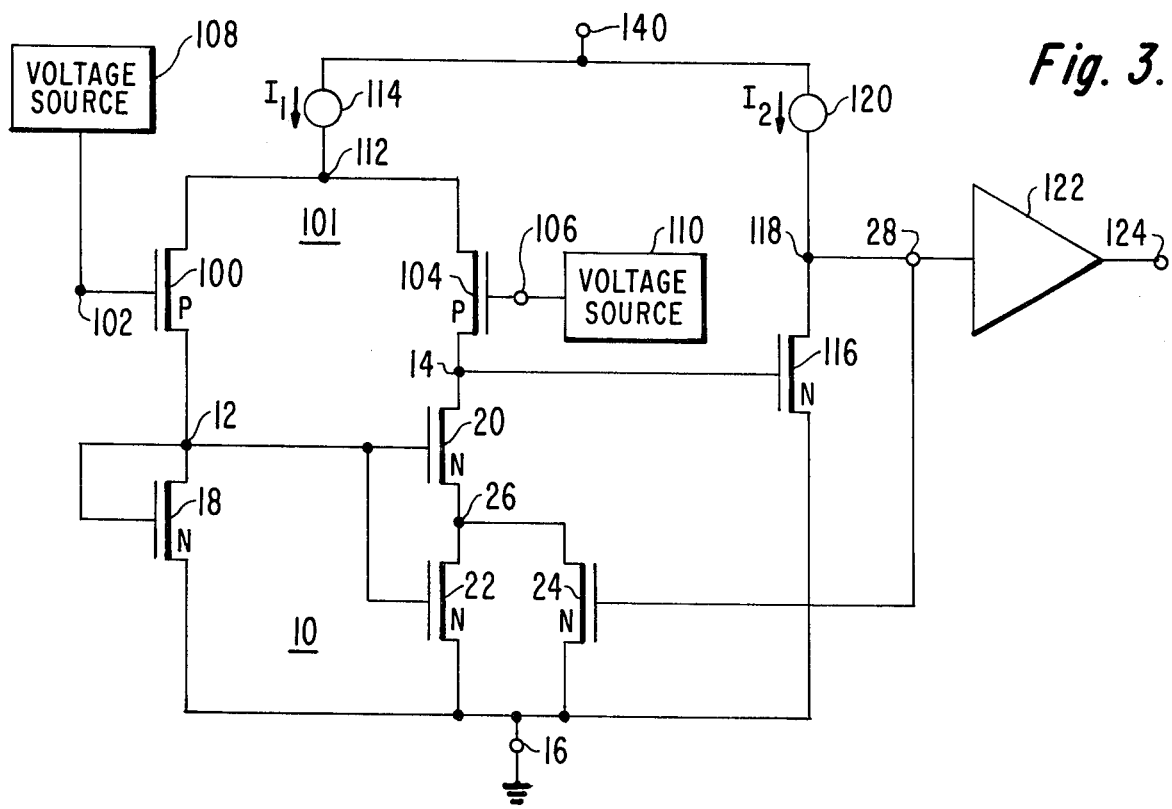
FIG. 3 is a schematic diagram of a comparator circuit utilizing a controlled current gain amplifier according to the present invention.

FIG. 3 shows an amplifier circuit utilized as a comparator, which provides both hysteresis and one precisely known transition point, and which also avoids the above-described shortcomings of the prior art. Includes therein is CMA 10 of FIG. 1. P-channel MOS (PMOS) transistors 100 and 104 are arranged in a long-tailed pair configuration 101 to function as a source-coupled differential-input amplifier. Source 108 applies a first voltage via terminal 102 to the gate electrode of transistor 100, and source 110 applies a second voltage via terminal 106 to the gate electrode of transistor 104. Commonly, one of the first and second voltages is a fixed reference voltage and the other a varying signal voltage which is to be compared against the reference voltage. The source electrodes of transistors 100 and 104 are interconnected at node 112, to which current source 114 supplies a tail current $I_1$. The drain electrodes of transistors 100 and 104 are connected respectively to input terminal 12 and output terminal 14 of CMA 10. The gate electrode of NMOS transistor 116 is connected to terminal 14 while its conduction path is connected between node 118 and terminal 16. Current source 120, connected between terminal 140 and node 118, supplies a current $I_2$ and provides a high-impedance load to transistor 116. The voltage appearing at node 118 is applied to the control voltage input terminal 28 of CMA 10 at the gate electrode of transistor 24. Each of the current sources 114 and 120 can take the form of a large valued-resistor, or the source-to-drain path of a transistor with fixed source-to-gate bias potential, or a cascaded transistor connection, for example.

Amplifier 122 is connected between node 118 and circuit output terminal 124 to provide a buffer stage for isolating node 118 and any load that may be connected to circuit output terminal 124. This amplifier 122 may be, for example, a complementary MOS (CMOS) inverter.

If desired, amplifier 122 may be eliminated and the circuit output obtained at node 118.

Assume initially that the amplitude of a signal voltage present at terminal 102 is much more positive than that of a fixed reference voltage present at terminal 106. This conditions transistor 104 to conduct more of the current $I_1$ supplied by source 114 than transistor 100. Because the value of the output current of current mirror amplifier (CMA) 10 is limited to that of its input current in its linear region, the amplitude of the voltage at node 14 increases to accommodate the increased current. The gate potential of transistor 116 will increase sufficiently that the pronounced conduction of transistor 116 will clamp the voltage at node 118 to a value close to ground potential, establishing a "first state" for the comparator. For this condition, transistor 24 is turned off. Further increases in the signal voltage amplitude have no effect on the comparator state.

The dimensions of devices 18, 20 and 22 are chosen such that, with transistor 24 off, the series conduction of their conduction paths presents the same impedance to transistor 104 as the conduction path of transistor 18 does to transistor 100. This is done so that when transistors 100 and 104 are conducting equal currents, as would be the case when the voltages at terminals 102 and 106 are of equal amplitude, the voltages at nodes 12 and 14 are also substantially equal.

Now let the amplitude of the signal voltage at terminal 102 decrease. As this voltage approaches the value of the reference voltage at terminal 106, the voltage at node 14, because of the balanced load presented to transistors 100 and 104, approaches the value of the voltage at node 12 tending to a condition where the conduction of transistor 116 is related to that of transistor 18 in the same ratio as their W/L ratios. When the signal voltage becomes less positive than the reference voltage, the CMA output current flowing responsive to the increased drain current of transistor 100 tends to exceed the reduced drain current of transistor 104, reducing the voltage at node 14 and consequently reducing the source-to-gate potential of transistor 116 to cause it to stop conduction. Current source $I_2$ supplies current to node 118 to raise its potential close to the value of the voltage present at terminal 140, placing the comparator in its "second state". The increase of voltage at node 118 turns on transistor 24, thereby connecting its conduction path in parallel with that of transistor 22. This tends to increase the current gain of CMA 10 speeding the change of the comparator output signal to the second state and eliminating any equilibrium condition where the output signal is between first and second state values. Note that the comparator transition point for the circuit of FIG. 3 is when the signal voltage amplitude equals that of the reference voltage.

A further decrease in the amplitude of the signal voltage has no effect on the state of the comparator. Now let the amplitude of the signal voltage be increased to a value equal to that of the reference voltage. For this input condition, the voltage at node 14 is less than the value of the voltage at node 12. This is because the impedance of the interconnected conduction paths of transistors 20, 22 and 24 is less than that of transistor 18. Thus, even though one-half of the current supplied by source 114 may be flowing through each of transistors 100 and 104, the voltage at node 14 does not equal that at node 12 because of the above-mentioned impedance difference. This difference is due to the conduction of transistor 24. As the signal voltage amplitude is further increased, a value is eventually reached, this value being in excess of the value of the reference voltage, where the state of the comparator once more changes. This change of state turns on transistor 116, thereby turning off transistor 24. A further increase in the amplitude of the voltage at terminal 102 has no effect on the state of the comparator. When the amplitude of this signal voltage decreases, transition point for the comparator occurs where the values of the signal and reference voltages are equal.

In summary, for the condition where the amplitude of the signal voltage decreases from a value greater than to a value less than that of the reference voltage, the transition point of the comparator equals the value of the reference voltage, $V_{REF}$. Where the amplitude of the signal voltage is increasing from a value less than to a value greater than that of $V_{REF}$, the transition point equals $V_{REF}$ plus $V_H$ where $V_H$ represents the effects of the impedance imbalance created by the conduction of transistor 24. The voltage $V_H$ represents the hysteresis voltage of the circuit of FIG. 3. The value of $V_H$ is a function in part of the relative conduction path impedances of transistors 20, 22 and 24.

The circuit of FIG. 2 may be incorporated into the circuit of FIG. 3 if desired. It should be noted that the desired hysteresis characteristic has been introduced into the switching characteristics of the comparator of FIG. 3 without the introduction of any of the earlier mentioned shortcomings of the prior art circuit. For example, the input impedance both of terminals 102 and 106 is the input impedance of an MOS transistor. There has been no degradation of this impedance due to the introduction of hysteresis and, in addition, the value of the reference voltage at terminal 106 is unaffected by the hysteresis.

A current comparator inheres in the FIG. 3 voltage comparator. This current comparator comprising CMA 10, transistor 116, and current source 120 compares the drain currents of transistors 100 and 104 in FIG. 3. However, this current comparator configuration can be used to compare the relative values of a pair of unidirectional currents supplied by other means.

What is claimed is:

1. A current amplifier with controlled current gain comprising:
   input, output and common terminals;
   a plurality of transistors of a first conductivity type, each having first and second electrodes with a controlled conduction path therebetween and having a control electrode, the conduction of the controlled conduction path of each transistor being controlled responsive to the potential between its second and control electrodes;
   the first and second electrodes of the first of the plurality of transistors connected respectively to the input terminal and the common terminal;
   the first electrode of the second of the plurality of transistors connected to the output terminal;
   the first and second electrodes of the third of the plurality of transistors connected respectively to the second electrode of the second transistor and the common terminal;
   direct-coupled feedback means between the first electrode of the first transistor and its control electrode to adjust the potential at the control electrode of the first transistor and condition the first transistor to conduct current, as applied to said input terminal, through its controlled conduction path;
   means for applying a potential substantially equal to the potential at the control electrode of the first transistor to the control electrodes of the second and third transistors;
   a source of gain-controlling signal;
   a controlled impedance means connected between the common and output terminals; and
   means for applying the gain-controlling signal to the controlled impedance means to vary, in accordance with the applied signal, the current gain of the amplifier within a range between a predetermined minimum current gain as defined by a ratio of the conductances of the first, second and third of the plurality of transistors and a predetermined maximum current gain as defined by the ratio of the conductances of first and second of the plurality of transistors.

2. A current amplifier as set forth in claim 1 wherein the controlled impedance includes:
   a fourth of the plurality of transistors, having its control electrode connected to the source of gain-controlling signal, the conduction of its path being controlled responsive to the potential between its second and control electrodes, its first and its second electrodes being connected respectively to the second electrode of the second transistor and to the common terminal.

3. A curent amplifier with controlled current gain as set forth in claim 2 connected in combination with the following elements to form a current comparator with hysteresis:
  means for applying the current to be compared to said input and said output terminals, respectively, of said current amplifier with controlled current gain,
  a further transistor of the plurality of transistors having its second and control electrodes connected respectively to the common and output terminals of said current amplifier with controlled current gain; and
  means for supplying quiescent current demand to the first electrode of said further transistor, the last-mentioned means exhibiting resistance across which said gain-controlling signal is developed.

4. A current amplifier with controlled current gain as set forth in claim 2 connected in combination with the following elements to form a voltage comparator with hysteresis:
  fifth and sixth transistors of the plurality of transistors, each having a second conductivity type complementary to said first conductivity type, each having first and second electrodes with a controlled conduction path therebetween and each having a control electrode, the conduction of its path being controlled responsive to the potential between its second and control electrodes, the first electrodes of said fifth and said sixth transistors being connected respectively to the input terminals and to the output terminals of said current amplifier with controlled current gain;
  means for supplying current to an interconnection of the second electrodes of said fifth and said sixth transistors;
  means for applying the voltage to be compared to the control electrodes of said fifth and said sixth transistors, respectively;
  a seventh transistor of the plurality of transistors, of the first conductivity type, having its control and second terminals connected respectively to the output and common terminals of said current amplifier with controlled current gain; and
  means for supplying quiescent current demand to the first electrode of said seventh transistor, said means exhibiting resistance across which said gain-controlling signal is developed.

5. A current amplifier, the current gain of which may be varied in response to a control signal comprising in combination:
  input, output and common terminals;
  a source of control signal;
  a first insulated gate field effect transistor (IGFET) having first and second electrodes defining a conduction path therebetween and a control electrode, the first electrode of the conduction path of said first transistor coupled to said common terminal and said second electrode coupled to said control electrode and said input terminal;
  second and third IGFET's each having a control electrode and a conduction path, the control electrodes of said second and third IGFET's being connected to said input terminal and the conduction paths of said second and third IGFET's being serially connected between said output and said common terminals; and
  switching means having a conduction path and a control electrode, said switch control electrode being connected to said control signal source and said switch conduction path being connected in parallel connection with the conduction path of one of said second and third IGFET's.

6. The combination as set forth in claim 5 wherein said switch means comprises a fourth IGFET having a control electrode comprising said switch control electrode and a conduction path comprising said switch conduction path.

7. A current amplifier with controlled current gain as set forth in claim 6 connected in combination with the following elements to form a voltage comparator with hysteresis:
  fifth and sixth IGFET's of a conductivity type complementary to conductivity type of the other IGFET's, each of the fifth and sixth IGFET's having first and second electrodes and a controlled conduction path therebetween and a control electrode, the conduction of each path being controlled responsive to the potential between its second and control electrodes, the first electrodes of the fifth and the sixth IGFET's being connected respectively to the input terminal and to the output terminal of the current amplifier with controlled current gain;
  means for supplying current to the second electrodes of both the fifth and the sixth IGFET's;
  means for applying voltages to be compared to the control electrodes of the fifth and the sixth IGFET's, respectively;
  a seventh IGFET of the first conductivity type, having first and second electrodes and a controlled conduction path therebetween and a control electrode, the conduction of its path being controlled responsive to the potential between its second and control electrodes, the output and common terminals of the current amplifier with controlled current gain being connected respectively to the control and second electrodes of said seventh transistor; and
  means for supplying quiescent current demand to the first electrode of the seventh transistor, the means exhibiting resistance across which the control signals are developed.

8. A current amplifier with controlled current gain as set forth in claim 6 connected in combination with the following elements to form a current comparator with hysteresis:
  means for applying the current to be compared to the input and the output terminals, respectively, of the current amplifier with controlled current gain,
  a further transistor having first and second electrodes with a controlled conduction path therebetween and having a control electrode, the conduction of its path being controlled responsive to the potential between its second and control electrodes, the second and control electrodes connected respectively to the common and output terminals of the current amplifier with controlled current gain; and
  means for supplying quiescent current demand to the first electrode of the further transistor, the last-mentioned means exhibiting resistance across which said gain-controlling signal is developed.

9. The combination set forth in claim 5 further including a series transistor of said first conductivity type having first and second electrodes defining a conduction path therebetween and a control electrode, the control electrode of said first and series transistors being interconnected, the first and second electrodes of said series transistor being connected to the first electrode of said first transistor and said common terminal respectively.

10. A current amplifier with controlled current gain as set forth in claim 8 connected in combination with the following elements to form a voltage comparator with hysteresis:

fifth and sixth IGFET'T of a conductivity type complementary to conductivity type of the other IGFET's, each of the fifth and sixth IGFET's having first and second electrodes and a controlled conduction path therebetween and having a control electrode, the conduction of each path being controlled responsive to the potential between its second and control electrodes, the first electrodes of the fifth and the sixth IGFET's being connected respectively to the inut terminal and to the output terminal of the current amplifier with controlled current gain;

means for supplying current to the second electrodes of both the fifth and the sixth IGFET's;

means for applying the voltages to be compared to the control electrodes of the fifth and the sixth IGFET's, respectively;

a seventh IGFET of the first conductivity type, having first and second electrodes and a controlled conduction path therebetween and having a control electrode, the conduction of its path being controlled responsive to the potential between its second and control electrodes, the output and common terminals of the current amplifier with controlled current gain being connected respectively to the control and second electrodes of said seventh transistor; and means for supplying quiescent current demand to the first electrode of the seventh transistor, the means exhibiting resistance across which the control signals are developed.

11. A current amplifier with controlled current gain as set forth in claim 9 connected in combination with the following elements to form a current comparator with hysteresis:

means for applying the current to be compared to the input and the output terminals, respectively, of the current amplifier with controlled current gain, a further transistor having first and second electrodes with a controlled conduction path therebetween and having a control electrode, the conduction of its path being controlled responsive to the potential between its second and control electrodes, the second and control electrodes connected respectively to the common and output terminals of the current amplifier with controlled current gain; and means for supplying quiescent current demand to the first electrode of the further transistor, the last-mentioned means exhibiting resistance across which the gain-controlling signal is developed.

* * * * *